(12) United States Patent
Ishikawa et al.

(10) Patent No.: US 9,325,292 B2
(45) Date of Patent: *Apr. 26, 2016

(54) PIEZOELECTRIC DEVICE WITH A PACKAGE INCLUDING A CONVEX PART

(71) Applicant: Seiko Epson Corporation, Tokyo (JP)

(72) Inventors: Katsuo Ishikawa, Tatsuno (JP); Akitoshi Hara, Fujimi (JP)

(73) Assignee: Seiko Epson Corporation (JP)

( * ) Notice: Subject to any disclaimer, the term of this patent is extended or adjusted under 35 U.S.C. 154(b) by 122 days.

This patent is subject to a terminal disclaimer.

(21) Appl. No.: 14/222,993

(22) Filed: Mar. 24, 2014

(65) Prior Publication Data

US 2014/0202245 A1 Jul. 24, 2014

Related U.S. Application Data

(63) Continuation of application No. 14/031,447, filed on Sep. 19, 2013, now Pat. No. 8,723,401, which is a continuation of application No. 12/958,642, filed on Dec. 2, 2010, now Pat. No. 8,643,254.

(30) Foreign Application Priority Data

Dec. 9, 2009 (JP) ................. 2009-279955

(51) Int. Cl.
*H03H 9/21* (2006.01)
*H03H 9/10* (2006.01)
*G01C 19/5607* (2012.01)
(Continued)

(52) U.S. Cl.
CPC ......... *H03H 9/1035* (2013.01); *G01C 19/5607* (2013.01); *H01L 41/053* (2013.01); *H01L 41/107* (2013.01); *H03B 5/32* (2013.01); *H03H 9/1021* (2013.01); *H03H 9/19* (2013.01); *H03H 9/21* (2013.01)

(58) Field of Classification Search
CPC ........ H03H 9/21; H03H 9/215; H03H 9/1021
USPC .................................. 310/370, 340
See application file for complete search history.

(56) References Cited

U.S. PATENT DOCUMENTS 5,596,243 A 1/1997 Tsuru et al.
6,606,772 B1 8/2003 Nohara et al.
(Continued)

FOREIGN PATENT DOCUMENTS

CN 1349304 A 5/2002
CN 1764067 A 4/2006
(Continued)

*Primary Examiner* — J. San Martin
(74) *Attorney, Agent, or Firm* — Harness, Dickey & Pierce, P.L.C.

(57) ABSTRACT

A piezoelectric device includes: a piezoelectric vibrating reed; and a package, wherein the piezoelectric vibrating reed has a vibrating part and first and second supporting arms extending from a base end part, the package has a base, a lid, a cavity defined by the base and the lid, a convex part projecting from the base or the lid into the cavity, a length of the first supporting arm is shorter than a length of the second supporting arm, and the convex part is provided in a range ahead of a leading end of the first vibrating arm in an extension direction of the first supporting arm and at least partially overlapping with the second supporting arm in a length direction of the piezoelectric vibrating reed so as not to overlap with the piezoelectric vibrating reed in a plan view.

20 Claims, 4 Drawing Sheets

(51) Int. Cl.
*H01L 41/053* (2006.01)
*H01L 41/107* (2006.01)
*H03B 5/32* (2006.01)
*H03H 9/19* (2006.01)

(56) References Cited

U.S. PATENT DOCUMENTS

| | | | |
|---|---|---|---|
| 6,960,870 | B2 | 11/2005 | Kikushima et al. |
| 7,061,167 | B2 | 6/2006 | Yamada |
| 7,067,966 | B2 | 6/2006 | Tanaya |
| 7,205,708 | B2 | 4/2007 | Yamada |
| 7,714,484 | B2 | 5/2010 | Hara et al. |
| 7,872,401 | B2 | 1/2011 | Onitsuka et al. |
| 8,020,265 | B2 | 9/2011 | Onitsuka et al. |
| 8,281,468 | B2 | 10/2012 | Funabiki et al. |
| 8,334,639 | B2 | 12/2012 | Saita |
| 8,643,254 | B2 * | 2/2014 | Ishikawa .............. H03H 9/1021 310/340 |
| 2006/0082261 | A1 | 4/2006 | Tanaya |
| 2008/0211350 | A1 | 9/2008 | Tanaya et al. |
| 2011/0068876 | A1 | 3/2011 | Yamada et al. |
| 2011/0260586 | A1 | 10/2011 | Kawase et al. |

FOREIGN PATENT DOCUMENTS

| | | |
|---|---|---|
| JP | 2002-121037 A | 4/2002 |
| JP | 2002-171152 A | 6/2002 |
| JP | 2004-254234 A | 9/2004 |
| JP | 2004-297198 A | 10/2004 |
| JP | 2004-343541 A | 12/2004 |
| JP | 2005-005896 A | 1/2005 |
| JP | 2005-318447 A | 11/2005 |
| JP | 2006-332727 A | 12/2006 |
| JP | 2009-021794 A | 1/2009 |

* cited by examiner

PIEZOELECTRIC DEVICE WITH A PACKAGE INCLUDING A CONVEX PART

CROSS REFERENCE TO RELATED APPLICATIONS

This application is a continuation of U.S. patent application Ser. No. 14/031,447 filed Sep. 19, 2013 which is a continuation of U.S. patent application Ser. No. 12/958,642 filed on Dec. 2, 2010 which claims priority to Japanese Patent Application No. 2009-279955 filed on Dec. 9, 2009, the disclosures of the above applications are incorporated herein by reference in their entireties.

BACKGROUND

1. Technical Field

The present invention relates to a piezoelectric device such as a piezoelectric vibrator or a piezoelectric oscillator used for various kinds of electronic equipment, and specifically, to a surface-mount piezoelectric device that air-tightly seals a package accommodating a piezoelectric vibrating reed.

2. Related Art

In related art, as piezoelectric devices, many surface-mount piezoelectric devices suitable for mounting on a circuit board or the like have been used. Generally, a surface-mount piezoelectric device includes a box-shaped thin base made of an insulating material such as ceramic or the like, and a flat plate-like lid joined thereto, and employs a package structure for mounting and air-tightly sealing a piezoelectric vibrating reed inside. Further, smaller and thinner piezoelectric devices are demanded as recent electric equipment becomes smaller and thinner.

To downsize the piezoelectric device, a tuning-fork piezoelectric vibrating reed having a pair of vibrating arms extending from a base end part in parallel, and a supporting arm extending from the base end part in parallel to the vibrating arms and provided with an extraction electrode from an excitation electrode is known (for example, see JP-A-2004-297198). A piezoelectric vibrating reed of thickness-shear mode having a vibrating part of a thin rectangular plate and a structure similarly including a supporting arm extending from a base end of the vibrating part in parallel thereto and provided with an extraction electrode from an excitation electrode is also known (for example, see JP-A-2009-21794).

These piezoelectric vibrating reeds are electrically connected and mechanically fixedly supported onto the supporting arm by fixing it to a mount electrode of the package with a conducting adhesive. Accordingly, compared to the related art structure in which the piezoelectric vibrating reed is cantilevered and fixedly supported with a conducting adhesive in the base end part, the dimension of the base end part in the longitudinal direction is smaller and the piezoelectric vibrating reed and the piezoelectric device may be downsized by the amount.

Typically, one supporting arm of the piezoelectric vibrating reed is provided for each side of the vibrating arm or the vibrating part for fixing the piezoelectric vibrating reed with balance. Further, only one supporting arm may be provided at one side of the vibrating arm or the vibrating part and fixed to the package in the supporting arm and the base end part (for example, see JP-A-2004-343541).

Furthermore, regarding the tuning-fork piezoelectric vibrating reed, the entire vibrating reed may be downsized in the longitudinal direction by forming weight parts having enlarged widths at the leading ends of the vibrating arms to shorten the vibrating arms (for example, see JP-A-2005-5896). By the wider weight parts, generation of the higher-order vibration may be suppressed and stability of the vibration frequency may be obtained.

In addition, in the surface-mount piezoelectric device, in order to eject gas and moisture produced from a sealing material at joining between the lid and the base and/or to seal the interior under a desired vacuum condition or in a desired atmosphere, a package structure in which a sealing hole communicating with the outside is provided in advance and the hole is closed after joining between the lid and the base is used. In many cases, the sealing hole of the package is provided in the base having a structure in which thin plates of a ceramic material are laminated (for example, see JP-A-2009-21794, JP-A-2004-343541, JP-A-2006-332727), however, it may be provided in the flat plate-like lid (for example, see JP-A-2002-171152).

The sealing hole of the package is closed by irradiating a spherical-shaped or pellet-shaped sealing material of a low-melting-point metal placed therein with a laser beam, a halogen lamp, or the like to instantaneously heating and melting the material. In this regard, it is preferable that the sealing hole has an inner opening diameter made smaller than an outer opening diameter so that the sealing material may not drop into the package. If its base has a laminated structure of ceramic thin plates, the sealing hole is formed to have a two-layer structure with a step by coaxially arranging a larger diameter hole provided in the ceramic thin plate forming the bottom plate and a smaller diameter hole provided in the ceramic thin plate laminated thereon. Further, in the lid of a metal flat plate, a sealing hole may be formed by forming a downward convex part using a jig such as a punch and opening a through hole at the center thereof.

The above described sealing hole in related art is provided to overlap with the piezoelectric vibrating reed in a plan view to reduce the plan dimension of the package in either case where the hole is provided in the base or the lid of the package. Particularly, in the case where the sealing hole is provided in a position overlapping with the excitation electrode of the piezoelectric vibrating reed, the vibration frequency of the piezoelectric vibrating reed may be fine-tuned by externally applying a laser beam or the like from the outside via the sealing hole to partially remove the excitation electrode after joining of the lid to the base.

However, in the package in which the sealing hole is provided in the base and arranged to overlap with the piezoelectric vibrating reed as described above, it is necessary that the bottom plate part of the base has a laminated structure with at least two layers. Further, a gap should be provided between the inner opening of the sealing hole and the piezoelectric vibrating reed. Accordingly, it is difficult to make the package thinner and shorter in height. Similarly, in the case where the sealing hole is provided in the lid, a gap should be provided between the convex part of the lid inner surface and the piezoelectric vibrating reed, and thinning and shortening of the package are limited.

SUMMARY

An advantage of some aspects of the invention is to realize reduction in size and height in a piezoelectric device including a surface-mount package having a sealing hole in a base or a lid.

A piezoelectric device according to an aspect of the invention includes a piezoelectric vibrating reed, and a package that air-tightly seals the piezoelectric vibrating reed, wherein the piezoelectric vibrating reed has a vibrating part and first and second supporting arms extending from a base end part of the vibrating part along both sides of the vibrating part, the package has a box-shaped base of an insulating material, a flat plate-like lid joined to an upper part of the base, a cavity defined by the base and the lid for holding the piezoelectric vibrating reed inside thereof, a convex part projecting from the base or the lid into the cavity, and a sealing hole penetrating the convex part and opening into the cavity and to an outer surface of the package, the piezoelectric vibrating reed is fixedly supported on a bottom surface of the cavity in the first and second supporting arms, the sealing hole is air-tightly closed by a sealing material, a length of the first supporting arm is shorter than a length of the second supporting arm, and the convex part is provided in a range ahead of a leading end of the first supporting arm in an extension direction of the first supporting arm and at least partially overlapping with the second supporting arm in a length direction of the piezoelectric vibrating reed so as not to overlap with the piezoelectric vibrating reed in a plan view.

By making one of the supporting arms provided on both sides of the vibrating part shorter than the other, a planar space that does not overlap with the piezoelectric vibrating reed is secured within the cavity and the convex part is provided in the planar space and the sealing hole is opened, and thereby, the package may be made shorter in height and smaller in a plan view.

In one embodiment, in a width direction of the piezoelectric vibrating reed, the vibrating part is provided to be located nearer the longer second supporting arm than the shorter first supporting arm. Thereby, the position of the center of gravity of the piezoelectric vibrating reed is nearer the second supporting arm than the first supporting arm, and the piezoelectric vibrating reed may be supported with more balance and the vibration leakage of the piezoelectric vibrating reed may effectively be prevented and more stability of vibration may be realized.

Further, in another embodiment, the base is formed in a box shape by a laminated structure of plural insulating material plates, the bottom surface of the cavity is defined by a first insulating material plate and the convex part is defined by a second insulating material plate laminated on the first insulating material plate, and the sealing hole is formed to have a step inside thereof by a larger hole part formed in the first insulating material plate and a smaller hole part formed in the second insulating material plate continuously to the larger hole part. As described above, the base having the sealing hole with the step for placement of a spherical-shaped or the pellet-shaped sealing material may have a laminated structure of two insulating material plates at the minimum, and there is an advantage for making the package smaller in height.

In still another embodiment, the lid has the convex part and the sealing hole of the convex part has a tilted surface tapered from an outer surface of the lid toward the cavity, and thereby, similarly, the spherical-shaped or the pellet-shaped sealing material to be heated and melted by irradiation with a laser beam, a halogen lamp, or the like may be placed on the tilted surface of the sealing hole so as not to be dropped into the cavity.

In yet another embodiment, the vibrating part includes a tuning-fork piezoelectric vibrating reed having at least a pair of vibrating arms that extend from the base end part in parallel and flexurally vibrate. In this case, since the vibrating arms has wider weight parts on their leading ends, even when the vibrating arms are made shorter, generation of the higher-order vibration may be suppressed and stability of the vibration frequency may be obtained, and thus, the entire piezoelectric vibrating reed may be made smaller in the longitudinal direction.

In still yet another embodiment, the invention may be applied to the piezoelectric device including the vibrating part having a rectangular flat plate that performs thickness-shear vibration.

Further, in further another embodiment, the piezoelectric vibrating reed may be fixed not only to the first and second supporting arms but also to the bottom surface of the cavity in the base end part, and may be supported more stably and reliably.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred working examples of the invention will be described with reference to the accompanying drawings.

Figure 1A:
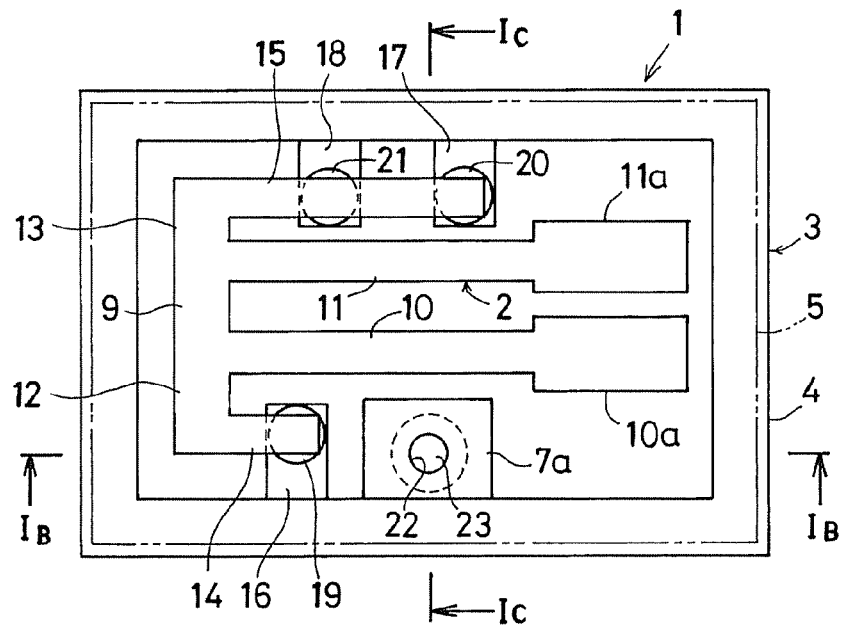
FIG. 1A is a plan view showing a first working example of a piezoelectric device according to an embodiment of the invention with a lid omitted.
Figure 1B:
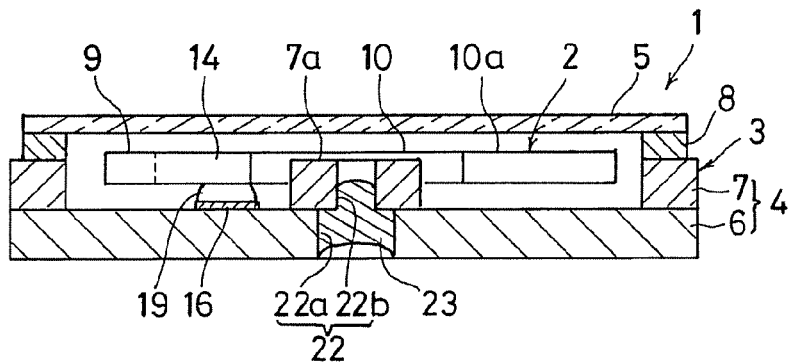
FIG. 1B is a longitudinal sectional view along IB-IB line.
Figure 1C:
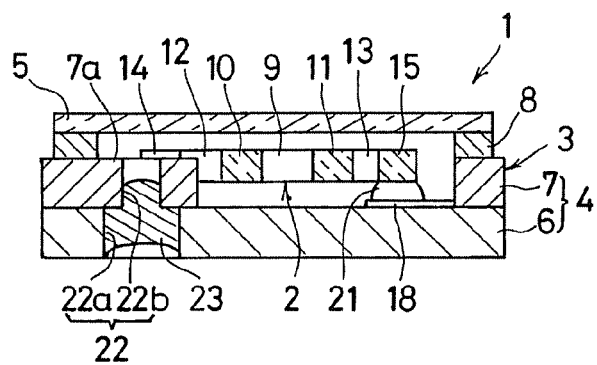
FIG. 1C is a longitudinal sectional view along IC-IC line.

FIGS. 1A to 1C show a first working example of a piezoelectric device according to an embodiment of the invention. A piezoelectric vibrator 1 of the first working example includes a package 3 that air-tightly seals a tuning-fork piezoelectric vibrating reed 2 inside. The package 3 has a box-shaped base 4 of a ceramic material and a lid 5 of a flat rectangular thin plate. In the base 4, a cavity for holding the piezoelectric vibrating reed 2 inside is defined by laminating a lower ceramics thin plate 6 shaped in a rectangular flat plate and an upper ceramics thin plate 7 shaped in a rectangular frame. The lid 5 is air-tightly joined to the upper end surface of the base 4 by a sealing material 8.

The lid 5 is formed by a metal material such as kovar, alloy 42, or SUS, or an insulating material such as glass, silicon, quartz, or ceramic. In the case where the lid 5 is formed by a metal material, for the sealing material 8, a seam ring of kovar or the like, or a brazing filler material of silver brazing, solder, or the like may be used. In the case where the lid 5 is formed by glass, silicon, quartz, ceramic, or the like, low-melting-point glass and adhesive may be used for the sealing material 8.

The piezoelectric vibrating reed 2 has a base end part 9 and a pair of vibrating arms 10, 11 extending from the base end part in the length direction in parallel to each other. The respective vibrating arms respectively have wider weight parts 10a, 11a at their leading ends. By the wider weight parts, even when the vibrating arms have shorter lengths, generation of the higher-order vibration may be suppressed and stability of the vibration frequency may be obtained, and the entire piezoelectric vibrating reed 2 may be made smaller in the longitudinal direction. The vibrating arms 10, 11 of the working example have widths constant over their entire lengths. In another working example, the widths of the vibrating arms may be formed to be narrower from the base end sides toward the leading ends.

Further, the piezoelectric vibrating reed 2 has a first supporting arm 14 and a second supporting arm 15 provided on both sides in the width direction thereof and coupled to coupling parts 12, 13 on both sides of the base end part 9. The first and second supporting arms 14, 15 extend from the respective coupling parts 12, 13 along both sides of the vibrating arms substantially in parallel to the vibrating arms. While the second supporting arm 15 has a length extending to near the weight part 11a of the vibrating arm 11, the first supporting arm 14 is formed shorter in length of about a half of the second supporting arm 15.

On the bottom surface of the cavity of the base 4, mount electrodes 16 to 18 are provided in a position generally corresponding to the leading end part of the first supporting arm 14 of the mounted piezoelectric vibrating reed 2 and positions respectively generally corresponding to the leading end part and the middle part of the second supporting arm 15. Regarding the piezoelectric vibrating reed 2, the leading end part of the first supporting arm 14 and the leading end part and the middle part of the second supporting arm 15 are fixedly bonded to the respectively corresponding mount electrodes 16 to 18 with conducting adhesives 19 to 21. Thereby, the piezoelectric vibrating reed electrically connects extraction electrodes (not shown) wired from the excitation electrodes (not shown) of the vibrating arms 10, 11 via the base end part 9 to the first and second supporting arms 14, 15 and is mechanically and fixedly supported at the same time.

Further, in the base 4, a convex part 7a projecting upward from the cavity bottom surface is provided. In the convex part 7a, a sealing hole 22 that holds communication between the inside of the cavity and the outside of the package 3 is formed. The sealing hole 22 is air-tightly closed by a suitable sealing material 23 of Au—Sn, solder, or the like.

As shown in FIGS. 1B and 1C, the convex part 7a is formed by the part extending from the upper ceramics thin plate 7 having the rectangular frame shape forming the base 4 to the inside of the cavity. The sealing hole 22 is formed to have a step inside by coaxially and continuously arranging a larger hole portion 22a penetrating the lower ceramics thin plate 6 defining the bottom surface of the cavity and a smaller hole portion 22b penetrating the extending part of the upper ceramics thin plate 7. By the step, at sealing of the sealing hole 22, a spherical-shaped or pellet-shaped sealing material may be placed in the sealing hole so as not to be dropped into the cavity and may be heated and melted by irradiation with a laser beam, a halogen lamp, or the like in a vacuum atmosphere.

The convex part 7a is provided in a planar space defined between the leading end of the shorter first supporting arm 14 and the weight part 10a of the adjacent vibrating arm 10. As described above, the convex part 7a is provided in a range ahead of the leading end of the first vibrating arm in the extension direction of the first supporting arm and at least partially overlapping with the second supporting arm in the length direction of the piezoelectric vibrating reed 2 so as not to overlap with the piezoelectric vibrating reed 2 in a plan view. Thereby, the package 3 may be made smaller in height and smaller in a plan view. Particularly, the base 4 may have a laminated structure of two ceramics thin plates at the minimum, and there is an advantage for making the package 3 smaller in height.

In addition, in the working example, regarding the piezoelectric vibrating reed 2, the coupling part 13 to the second supporting arm 15 of the base end part 9 is made shorter than the coupling part 12 to the first supporting arm 14 in the width direction, and the vibrating part including the vibrating arms 10, 11 is provided to be located nearer the second supporting arm than the first supporting arm. Thereby, the position of the center of gravity of the piezoelectric vibrating reed 2 is nearer the second supporting arm 15 than the first supporting arm 14, and the piezoelectric vibrating reed may be supported with more balance. Therefore, the vibration leakage of the piezoelectric vibrating reed 2 may effectively be prevented and more stability of vibration may be realized.

Figure 2A:
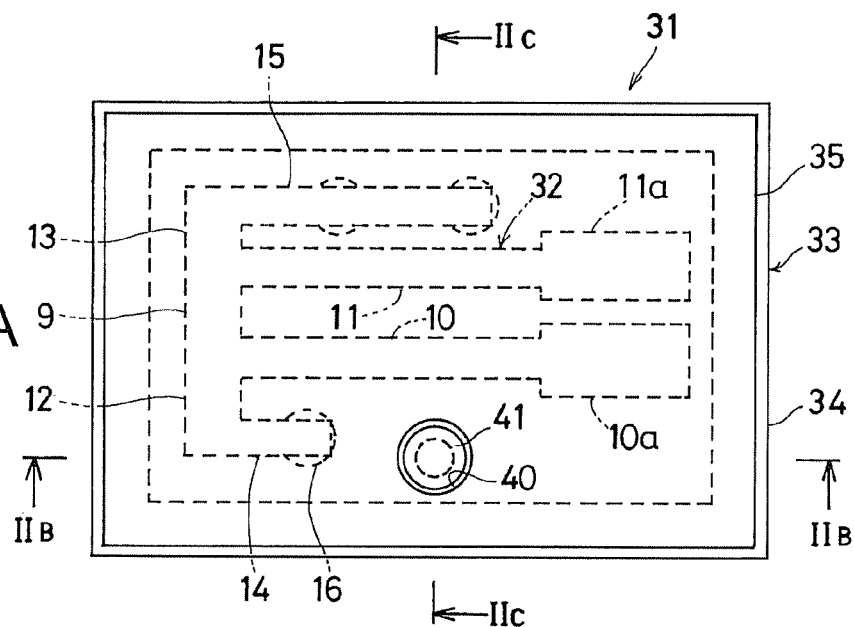
FIG. 2A is a plan view showing a second working example of the piezoelectric device according to the embodiment of the invention.
Figure 2B:
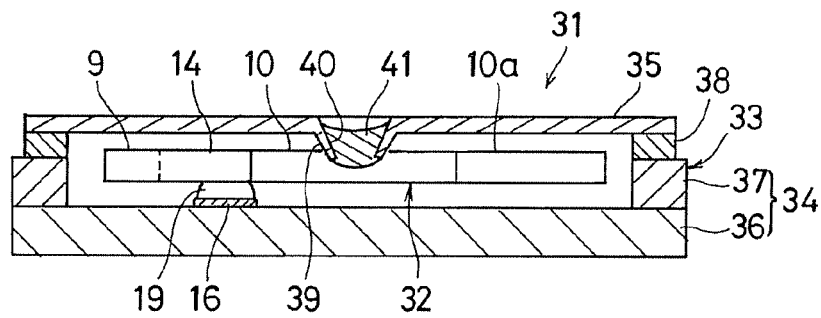
FIG. 2B is a longitudinal sectional view along IIB-IIB line.
Figure 2C:
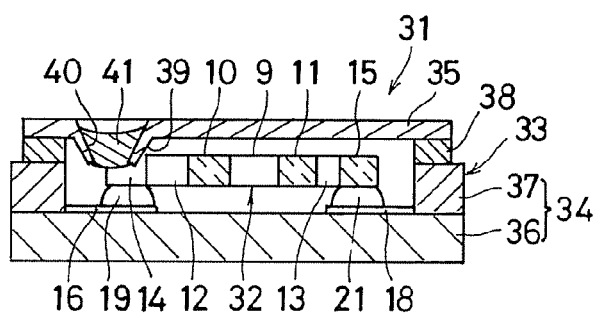
FIG. 2C is a longitudinal sectional view along IIC-IIC line.

FIGS. 2A to 2C show a second working example of the piezoelectric device according to the embodiment of the invention. A piezoelectric vibrator 31 of the second working example includes a package 33 that air-tightly seals a tuning-fork piezoelectric vibrating reed 32 inside. The package 33 has a box-shaped base 34 of a ceramic material and a lid 35 of a flat rectangular thin plate. In the base 34, a cavity for holding the piezoelectric vibrating reed 32 inside is defined by laminating a lower ceramics thin plate 36 shaped in a rectangular flat plate and an upper ceramics thin plate 37 shaped in a rectangular frame like in the base 4 of the first working example.

The piezoelectric vibrating reed 32 has completely the same configuration as that of the piezoelectric vibrating reed 2 of the first working example and is similarly fixedly supported by the base 34, and thus, further explanation will be omitted.

The lid 35 is air-tightly joined to the upper end surface of the base 34 by a sealing material 38. The lid 35 of the working example is formed by a metal material such as kovar, alloy 42, or SUS. For the sealing material 38, a seam ring of kovar or the like, or a brazing filler material of silver brazing, solder, or the like may be used.

In the lid 35, a convex part 39 projecting downward from its inner surface into the cavity is provided. At the center of the convex part 39, a sealing hole 40 that holds communication between the inside of the cavity and the outside of the package 33 is formed. The sealing hole 40 is air-tightly closed by a suitable sealing material 41 of Au—Sn, solder, or the like.

As shown in FIGS. 2B and 2C, the convex part 39 is formed in a downward conical shape, and the sealing hole 40 has a tilted surface tapered from the outer surface of the lid 35 toward the cavity. By the tilted surface, at sealing of the sealing hole 40, a spherical-shaped or pellet-shaped sealing material may be placed in the sealing hole so as not to be dropped into the cavity and may be heated and melted by irradiation with a laser beam, a halogen lamp, or the like in a vacuum atmosphere. The convex part 39 and the sealing hole 40 may be formed using a jig such as a punch, for example.

The convex part 39 is provided in a planar space defined between the leading end of the shorter first supporting arm 14 and the weight part 10a of the adjacent vibrating arm 10. As described above, the convex part 39 is provided in a range ahead of the leading end of the first vibrating arm in the extension direction of the first supporting arm and at least partially overlapping with the second supporting arm in the length direction of the piezoelectric vibrating reed 32 so as not to overlap with the piezoelectric vibrating reed 32 in a plan view. Thereby, the package 33 may be made smaller in height and smaller in a plan view.

Figure 3A:
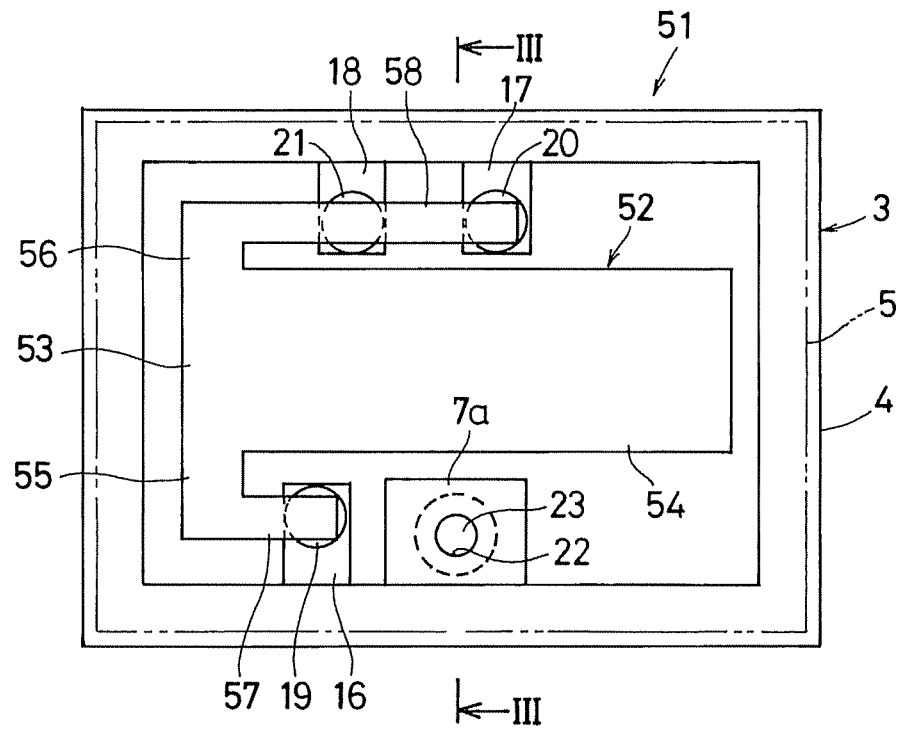
FIG. 3A is a plan view showing a third working example of the piezoelectric device according to the embodiment of the invention with a lid omitted.
Figure 3B:
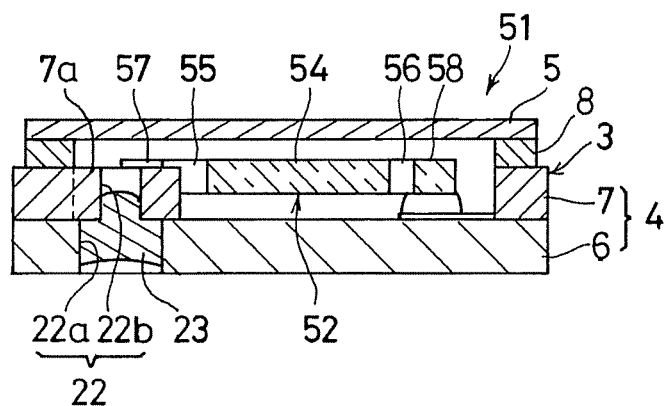
FIG. 3B is a longitudinal sectional view along III-III line.

FIGS. 3A to 3C show a third working example of the piezoelectric device according to the embodiment of the invention. A piezoelectric vibrator 51 of the third working example includes a package 3 that air-tightly seals a thickness-shear mode piezoelectric vibrating reed 52 inside. The package 3 has completely the same configuration as that of the package of the first working example, further explanation will be omitted.

The piezoelectric vibrating reed 52 has a base end part 53 and a vibrating part 54 having a rectangular flat plate shape extending from the base end part in the length direction. Further, the piezoelectric vibrating reed 52 has a first supporting arm 57 and a second supporting arm 58 provided on both sides in the width direction thereof and coupled to coupling parts 55, 56 on both sides of the base end part 53. The first and second supporting arms 57, 58 extend from the respective coupling parts along both sides of the vibrating part substantially in parallel thereto. The first supporting arm 57 is formed shorter in length of about a half of the second supporting arm 58.

The package 3 has the same configuration as that of the package of the first working example. In the working example, the convex part 7a provided in the base 4 is provided in a range ahead of the leading end of the first vibrating arm in the extension direction of the shorter first supporting arm 57 and at least partially overlapping with the second supporting arm 58 in the length direction of the piezoelectric vibrating reed so as not to overlap with the piezoelectric vibrating reed 52 in a plan view. Thereby, as in the case of the first working example, the package 3 may be made smaller in height and smaller in a plan view. Further, the base 4 may have a laminated structure of two ceramics thin plates at the minimum, and the package 3 may effectively be made smaller in height.

In the working example, regarding the piezoelectric vibrating reed 52, the coupling part 56 to the second supporting arm 58 of the base end part 53 is made shorter than the coupling part 55 to the first supporting arm 57 in the width direction, and the vibrating part 52 is provided to be located nearer the second supporting arm than the first supporting arm. Thereby, the position of the center of gravity of the piezoelectric vibrating reed 52 is nearer the second supporting arm 58 than the first supporting arm 57, and the piezoelectric vibrating reed may be supported with more balance. Therefore, the vibration leakage of the piezoelectric vibrating reed 52 may effectively be prevented and more stability of vibration may be realized.

Figure 4A:
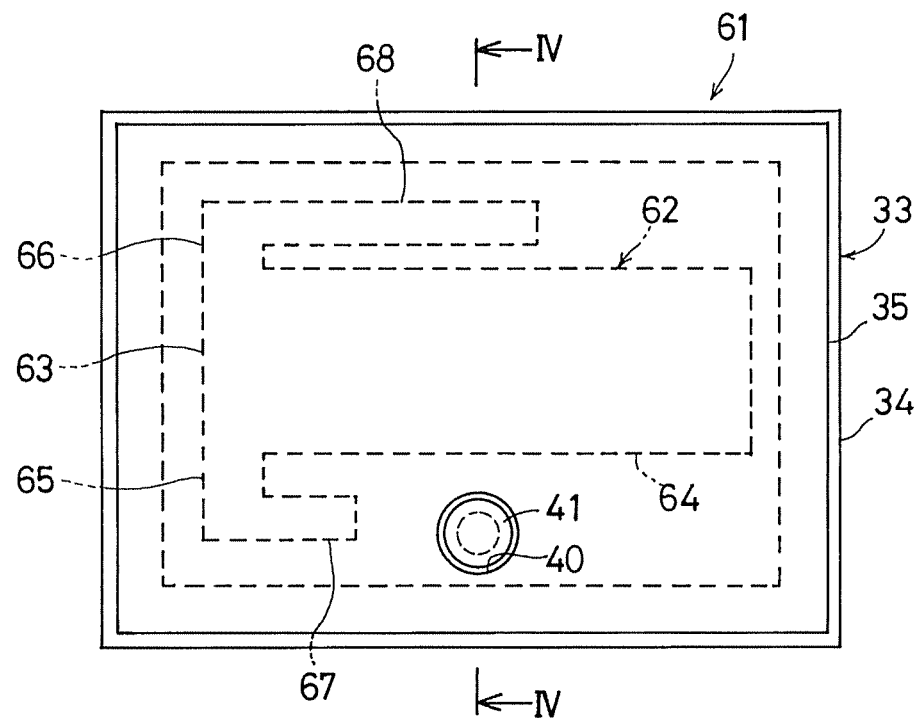
FIG. 4A is a plan view showing a fourth working example of the piezoelectric device according to the embodiment of the invention with a lid omitted.
Figure 4B:
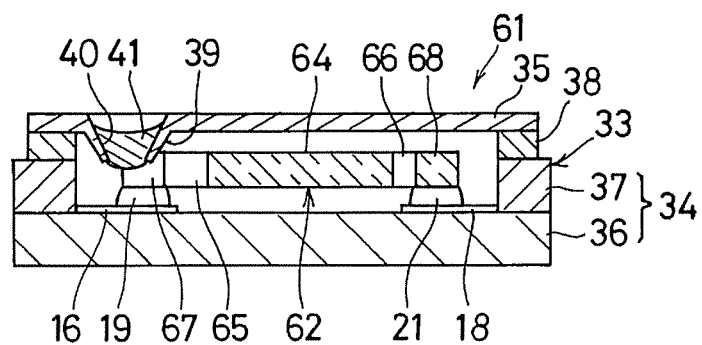
FIG. 4B is a longitudinal sectional view along IV-IV line.

FIGS. 4A and 4B show a fourth working example of the piezoelectric device according to the embodiment of the invention. A piezoelectric vibrator 61 of the fourth working example includes a package 33 that air-tightly seals a thickness-shear mode piezoelectric vibrating reed 62 inside. The package 33 has completely the same configuration as that of the package of the second working example, and further explanation will be omitted.

Like the piezoelectric vibrating reed 52 of the third working example, the piezoelectric vibrating reed 62 has a base end part 63, a vibrating part 64 having a rectangular flat plate shape extending from the base end part in the length direction, and a first supporting arm 67 and a second supporting arm 68 provided on both sides in the width direction thereof and coupled to coupling parts 65, 66 on both sides of the base end part 63. The first and second supporting arms 67, 68 extend from the respective coupling parts along both sides of the vibrating part substantially in parallel thereto. The first supporting arm 67 is formed shorter in length of about a half of the second supporting arm 68.

The package 33 has the same configuration as that of the package of the second working example. In the working example, the convex part 39 provided in the lid 35 is provided in a range ahead of the leading end of the first vibrating arm in the extension direction of the shorter first supporting arm 67 and at least partially overlapping with the second supporting arm 68 in the length direction of the piezoelectric vibrating reed so as not to overlap with the piezoelectric vibrating reed 62 in a plan view. Thereby, as in the case of the second working example, the package 33 may be made smaller in height and smaller in a plan view.

The embodiment of the invention is not limited to the working examples, and various modifications or alterations may be made within the technical scope. For example, the piezoelectric vibrating reed may be fixed to the cavity bottom surface of the base in the first and second supporting arms and the base end part, and thereby supported more stably and reliably. Further, the embodiment of the invention may be applied not only to the piezoelectric vibrators of the respective working examples but also to various piezoelectric devices like a piezoelectric gyro device having two pairs of vibrating arms extending from a base end part thereof.

What is claimed is:

1. A vibrator comprising:
a vibrating reed including a vibrating part and first and second supporting parts that support the vibrating part;
a package in which the vibrating reed is mounted, the package including a base and a lid fixed to the base; and
a vent that penetrates the package from an interior to an exterior thereof, the vent being sealed by a sealing material,
wherein the first and second supporting parts are fixed to the base,
a length of the first supporting part is less than a length of the second supporting part, and
the sealing material is positioned outside an area where the vibrating reed is located in a plan view, and the sealing material is located closer to the first supporting part than the second supporting part.

2. The vibrator according to claim 1, wherein
the vibrating part is located closer to the second supporting part than the first supporting part in the plan view.

3. The vibrator according to claim 1, wherein
the vibrating part is a vibrating arm that flexurally vibrates.

4. The vibrator according to claim 3, wherein
the vibrating arm has a weight part on a leading end thereof.

5. The vibrator according to claim 1, wherein
the vibrating part performs thickness-shear vibration.

6. The vibrator according to claim 1, wherein
the base has a recess with a bottom surface,
the lid closes an opening of the recess, and
the vibrating reed is mounted inside of the recess.

7. The vibrator according to claim 6, wherein
the vibrating part is located closer to the second supporting part than the first supporting part in the plan view.

8. The vibrator according to claim 6, wherein
the vibrating part is a vibrating arm that flexurally vibrates.

9. The vibrator according to claim 6, wherein
the vibrating part performs thickness-shear vibration.

10. The vibrator according to claim 6, wherein
a convex member projects from an inner surface of the recess into a cavity defined by the base and the lid, and
the sealing material is provided at the convex part.

11. The vibrator according to claim 10, wherein
the vibrating part is located closer to the second supporting part than the first supporting part in the plan view.

12. The vibrator according to claim 10, wherein
the vibrating part is a vibrating arm that flexurally vibrates.

13. The vibrator according to claim 10, wherein
the vibrating part performs thickness-shear vibration.
14. The vibrator according to claim 10, wherein
the first supporting part extends along one side of the vibrating part in a longitudinal direction,
the second supporting part extends along another side of the vibrating part in the longitudinal direction, and
the convex member is spaced apart from a leading end of the first supporting part in the longitudinal direction.
15. The vibrator according to claim 14, wherein
the vibrating part is located closer to the second supporting part than the first supporting part in the plan view.
16. The vibrator according to claim 14, wherein
the vibrating part is a vibrating arm that flexurally vibrates.
17. The vibrator according to claim 14, wherein
the vibrating part performs thickness-shear vibration.
18. A oscillator comprising:
the vibrator according to claim 1.
19. A gyro comprising:
the vibrator according to claim 1.
20. An electronic device comprising:
the vibrator according to claim 1.

\* \* \* \* \*